(12) United States Patent
Shen

(10) Patent No.: US 10,497,515 B2
(45) Date of Patent: Dec. 3, 2019

(54) CONNECTOR STRUCTURE

(71) Applicant: COOLER MASTER TECHNOLOGY INC., New Taipei (TW)

(72) Inventor: Yu-Wei Shen, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/206,955

(22) Filed: Nov. 30, 2018

(65) Prior Publication Data

US 2019/0172644 A1    Jun. 6, 2019

(30) Foreign Application Priority Data

Dec. 1, 2017   (TW) .............................. 106217954 U

(51) Int. Cl.
| | |
|---|---|
| *H01R 12/00* | (2006.01) |
| *H01G 4/232* | (2006.01) |
| *H01G 2/10* | (2006.01) |
| *H05K 1/11* | (2006.01) |

(52) U.S. Cl.
CPC ............... *H01G 4/232* (2013.01); *H01G 2/10* (2013.01); *H05K 1/11* (2013.01)

(58) Field of Classification Search
USPC .......... 439/62, 74, 79, 540.1, 631, 633, 638, 439/654, 637, 326
See application file for complete search history.

(56) References Cited

U.S. PATENT DOCUMENTS

| | | | |
|---|---|---|---|
| 7,338,321 B2 * | 3/2008 | Laurx ................. | H01R 13/514 439/378 |
| 2009/0141440 A1 * | 6/2009 | Okumura ......... | G06K 19/07732 361/679.32 |

* cited by examiner

*Primary Examiner* — Phuong Chi Thi Nguyen
(74) *Attorney, Agent, or Firm* — Maschoff Brennan

(57) ABSTRACT

A connector structure includes a first connector, a second connector and a capacitance device. The first connector has a first end and a second end opposite to the first end. A plurality of first metal terminals extends in a first direction at the first end. The second end is configured to be detachably connected to a first external device. The second connector has a third end and a fourth end opposite to the third end. A plurality of second metal terminals extends in a second direction at the third end. The second direction is not parallel to the first direction. The fourth end is configured to be detachably connected to a second external device. The capacitance device includes capacitors coupled to the first connector and the second connector respectively through the first metal terminals and the second metal terminals.

13 Claims, 5 Drawing Sheets

CONNECTOR STRUCTURE

This non-provisional application claims priority under 35 U.S.C. § 119(a) on Patent Application No(s). 106217954 filed in Taiwan, R.O.C. on Dec. 1, 2017, the entire contents of which are hereby incorporated by reference.

TECHNICAL FIELD

The disclosure relates to a connector structure, more particularly to a connector structure including a capacitance device.

BACKGROUND

The conventional power connectors are adapted to connect two electrical devices so as to transmit power from one of the two electrical devices to the other one. However, surge may occur when the power is transmitted between these two electrical devices. In general, there are two kinds of surge: the lightning surge due to lightning and the switching surge due to ON/OFF switching of a circuit. Specifically, the switching surge is the surge occurring at the time when a circuit is turned on. The switching surge may occur due to electronic elements such as relays, switches or transistors. Malfunction or even damages in internal circuits of devices as well as shorten lives of devices may be caused if the surge occurs in the process of power transmission.

In order to avoid the situations in which negative effects, caused by the surge, are applied to devices, most devices are equipped with circuit protecting modules so as to prevent the surge from damaging those devices. However, not all of devices are equipped with such circuit protecting modules. In fact, circuit loops of some connectors used for connecting two devices are not equipped with circuit protecting modules. It has been considered as an essential issue to develop a connector having functions of surge protecting in this field because of the negative effects caused by the surge.

SUMMARY

The present disclosure provides a connector structure capable of filtering surge with respect to power transmitted between two devices, so as to achieve the purpose of protecting devices.

A connector structure is disclosed according to one embodiment of the present disclosure. A connector structure includes a first connector, a second connector and a circuit board. The first connector has a first end and a second end opposite to the first end, with the first connector having a plurality of first metal terminals extending in a first direction at the first end, wherein the second end of the first connector is configured to be detachably connected to a first external device. The second connector has a third end and a fourth end opposite to the third end, with the second connector having a plurality of second metal terminals extending in a second direction at the third end, wherein the second direction is not parallel to the first direction, and the fourth end of the second connector is configured to be detachably connected to a second external device. The circuit board is electrically connected to the first connector and the second connector respectively through the plurality of first metal terminals and the plurality of second metal terminals.

A connector structure is disclosed according to one embodiment of the present disclosure. A connector structure includes a first cover, a second cover, a first connector, a second connector and a circuit board. The first cover has a first opening in a first direction. The second cover is assembled with the first cover to form an accommodating space and a second opening, with the accommodating space communicated with the first opening, and the second opening facing in a second direction not parallel to the first direction. The first connector has a first end and a second end, with the first end located in the accommodating space and the second end adapted to be detachably connected to a first external device through the first opening. The second connector has a third end and a fourth end, with the third end disposed in the accommodating space through the second opening and the fourth end adapted to be detachably connected to a second external device. The circuit board is disposed in the accommodating space and adapted to be electrically connected to the first end of the first connector and the third end of the second connector.

A connector structure is disclosed according to one embodiment of the present disclosure. The connector structure includes a first connector, a second connector and a capacitance device. The first connector has a first end and a second end opposite to the first end. The first connector has a plurality of first metal terminals extending in a first direction at the first end, wherein the second end of the first connector is configured to be detachably connected to a first external device. The second connector has a third end and a fourth end opposite to the third end. The second connector has a plurality of second metal terminals extending in a second direction at the third end, wherein the second direction is not parallel to the first direction, and the fourth end of the second connector is configured to be detachably connected to a second external device. The capacitance device includes at least one capacitor electrically connected to the first connector and the second connector respectively through the plurality of first metal terminals and the plurality of second metal terminals. The at least one capacitor is configured to receive a first power from the first external device and transmit a second power to the second external device.

A connector structure is disclosed according to another embodiment of the present disclosure. The connector structure includes a first cover, a second cover, a first connector, second connector and a capacitance device. The first cover has a first opening in a first direction. The second cover is assembled with the first cover to form an accommodating space and a second opening. The accommodating space is communicated with the first opening, and the second opening facing in a second direction not parallel to the first direction. The first connector has a first end and a second end. The first end is located in the accommodating space and the second end is adapted to be detachably connected to a first external device through the first opening. The second connector has a third end and a fourth end. The third end is disposed in the accommodating space through the second opening and the fourth end is adapted to be detachably connected to a second external device. The capacitance device is disposed in the accommodating space and adapted to be electrically connected to the first end of the first connector and the third end of the second connector.

Based one the above description, in the connector structure of the present disclosure, the capacitor(s) included in the capacitance device are respectively connected to the first connector and the second connector, so that the capacitor(s) receives power from the first device and then delivers power to the second device when the first connector and the second connector are connected to the first device and the second device respectively. As a result, the surge is absorbed and eliminated, and the devices are not damaged by the surge.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
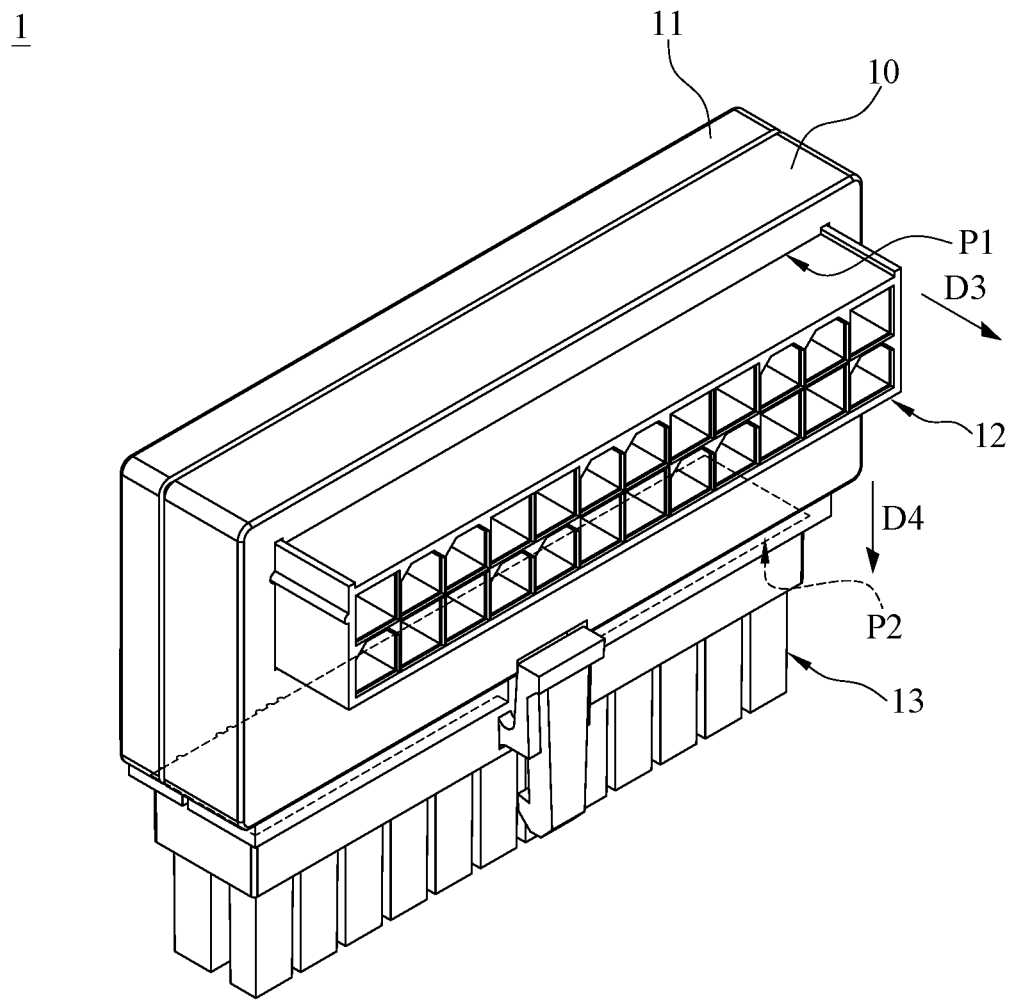
FIG. 1 is a diagram of assembled connector structure according to one embodiment of the present disclosure.
Figure 2:
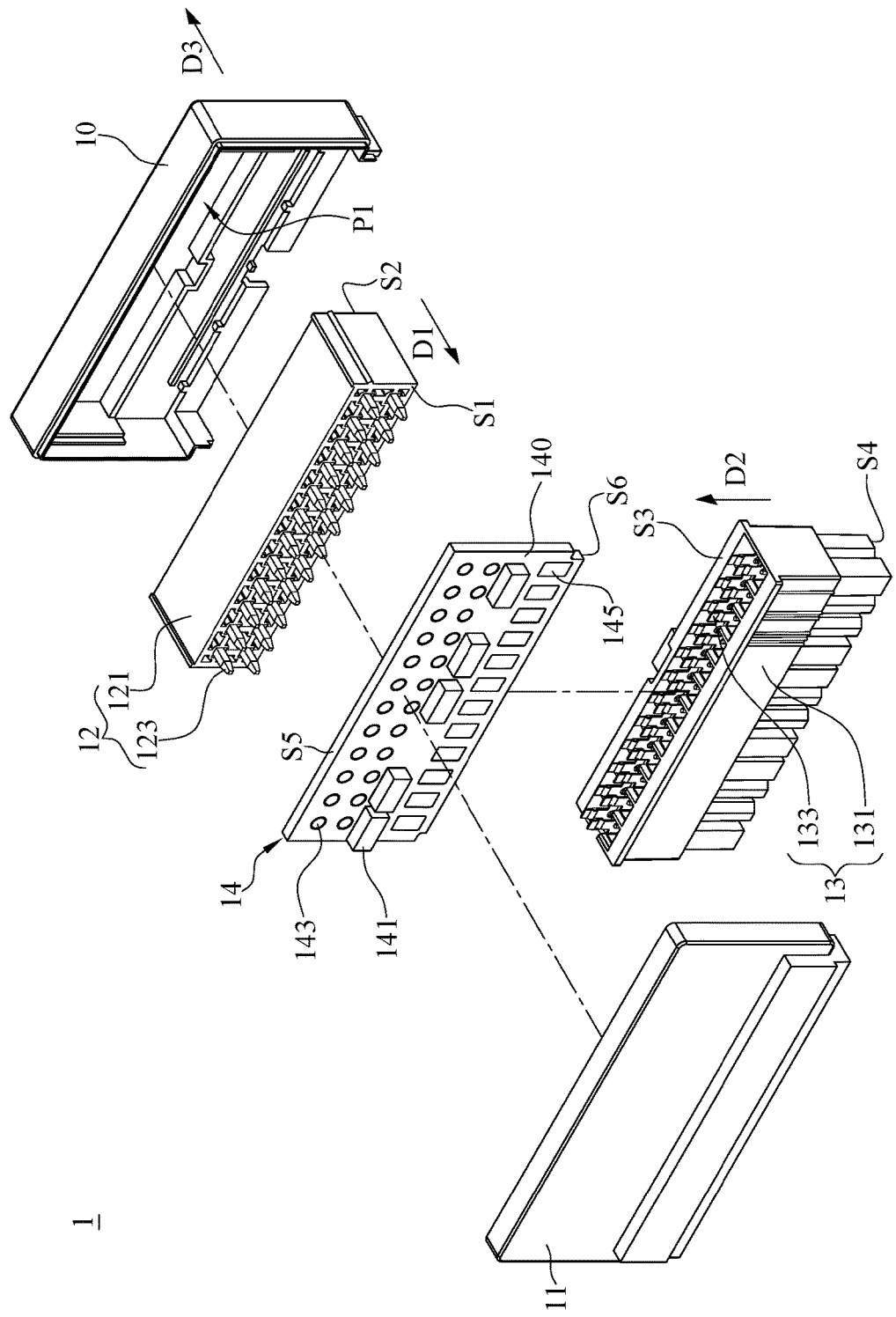
FIG. 2 is a diagram of disassembled connector structure according to one embodiment of the present disclosure.
Figure 3:
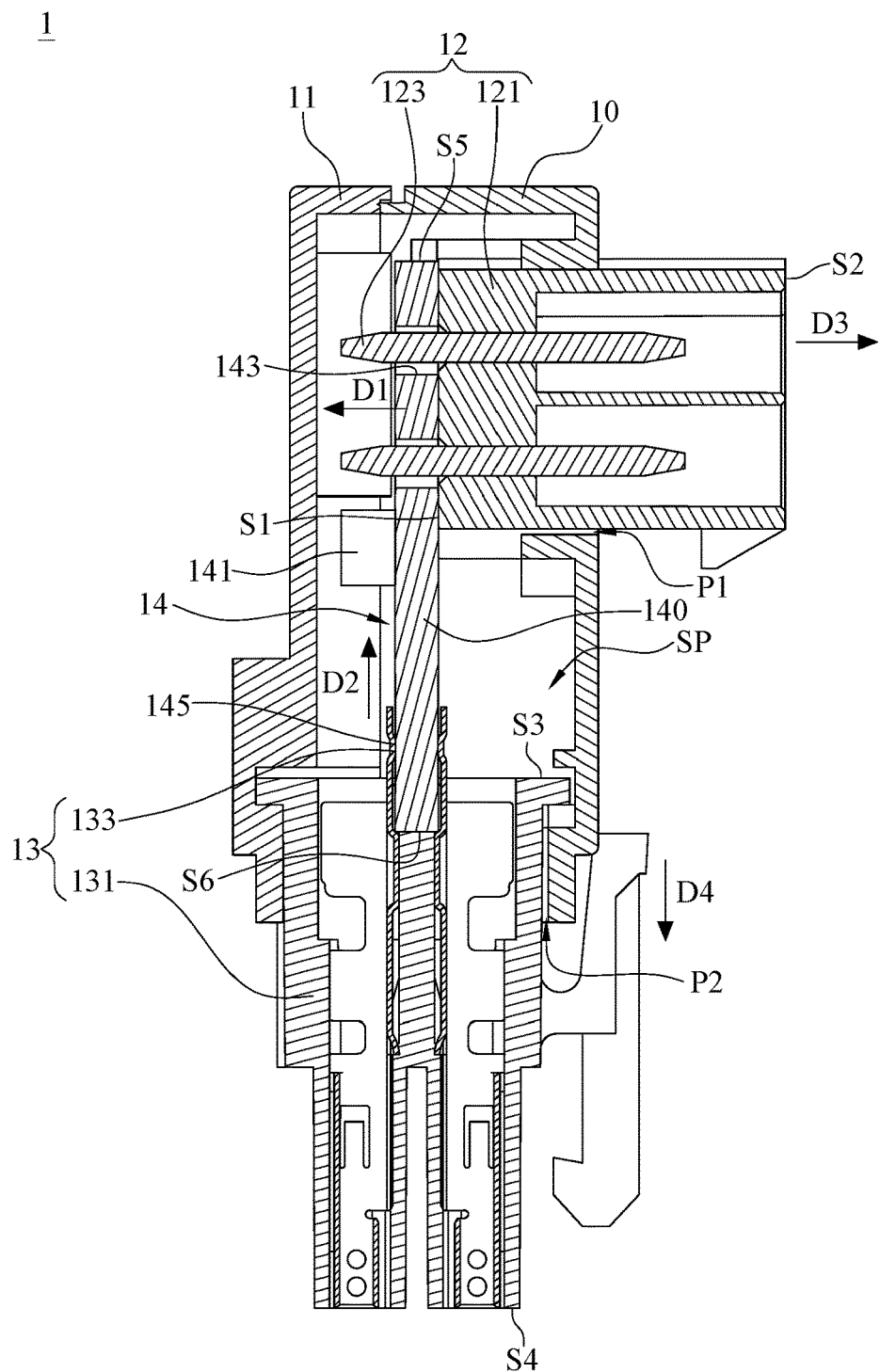
FIG. 3 is a diagram of sectional view of connector structure according to one embodiment of the present disclosure.

Please refer to FIG. 1, FIG. 2 and FIG. 3. FIG. 1 is a diagram of assembled connector structure according to one embodiment of the present disclosure. FIG. 2 is a diagram of disassembled connector structure according to one embodiment of the present disclosure. FIG. 3 is a diagram of sectional view of connector structure according to one embodiment of the present disclosure. As shown in FIG. 1 to FIG. 3, the connector structure 1 includes a first connector 12, a second connector 13 and a capacitance device 14. The first connector 12 has a first end S1 and a second end S2 opposite to the first end S1. The first connector 12 has a first housing 121 and a plurality of first metal terminals 123. The plurality of first metal terminals 123 is assembled with the first housing 121. The plurality of first metal terminals 123 extends in a first direction D1 at the first end S1. The second end S2 of the first connector 12 is configured to be detachably connected to a first external device 20.

The second connector 13 has a third end S3 and a fourth end S4 opposite to the third end S3. The second connector 13 has a second housing 131 and a plurality of second metal terminals 133. The plurality of second metal terminals 133 is assembled with the second housing 131. The plurality of second metal terminals 133 extends in a second direction D2 at the third end S3. In this embodiment, the second direction D2 is not parallel to the first direction D1. More specifically, the direction in which the first metal terminals 123 extend is different from the direction in which the second metal terminals 133 extend. For example, the direction in which the first metal terminals 123 extend is perpendicular to the direction in which the second metal terminals 133 extend. The fourth end S4 of the second connector 13 is configured to be detachably connected to a second external device 30. The capacitance device 14 includes a plurality of capacitors 141 electrically connected to the first connector 12 and the second connector 13 respectively through the first metal terminals 123 and the second metal terminals 133.

Figure 4:
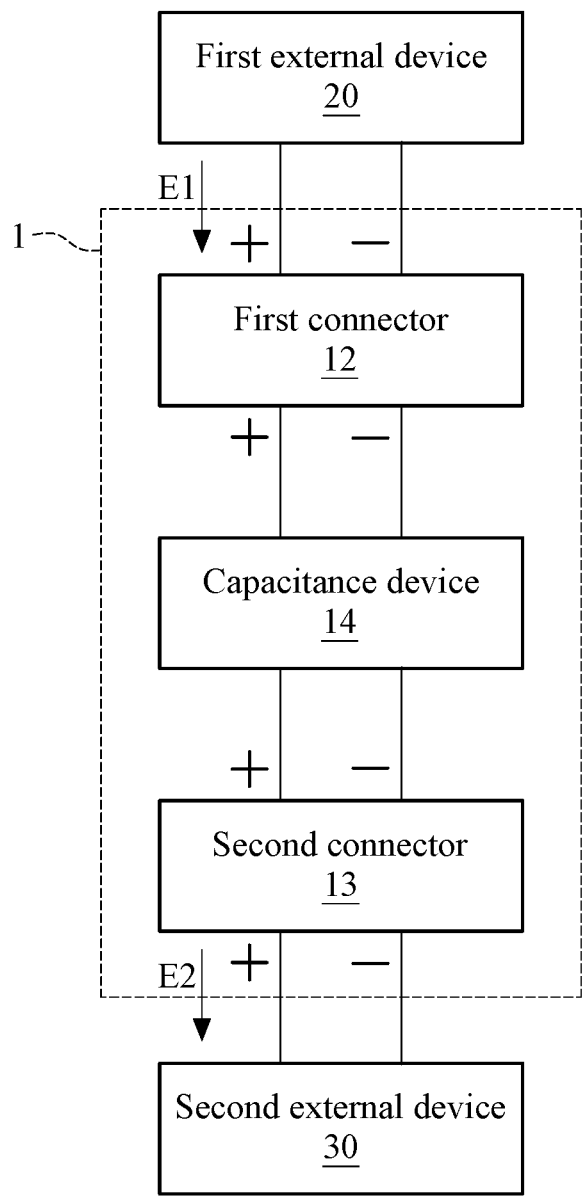
FIG. 4 is a block diagram of connectors and external devices according to one embodiment of the present disclosure.

Please further refer to FIG. 4, which is a block diagram of connectors and external devices according to one embodiment of the present disclosure. As shown in FIG. 4, the capacitors 141 included in the connector structure of the present disclosure are configured to receive a first power E1 from the first external device 20 and further transmits a second power E2 to the second external device 30. In an example, the first external device 20 is a device used for supplying power, such as a power supply, and the second external device 30 is a device used for receiving power, such as a computer motherboard. The present disclosure is not limited to the example described above. In one example, the second end S2 of the first connector 12 includes a plurality of first connecting pins adapted to be connected to the first external device 20 serving as a power supply, and the fourth end S4 of the second connector 13 includes a plurality of second connecting pins adapted to be connected to the second external device 30 serving as a computer motherboard.

The number of the first connecting pins and the number of second connecting pins of the present disclosure are not limited to the above embodiments even though both of the number of the first connecting pins and the number of the second connecting pins are 24 in the above embodiment. In practice, it is allowable to respectively plug/remove the first connector 12 and the second connector 13 of the connector structure 1 to/from the first external device 20 and the second external device 30 repeatedly. When the first connector 12 and the second connector 13 of the connector structure 1 respectively connected to the first external device 20 and the second external device 30, a parallel loop is formed by the capacitors 141 included in the capacitance device 14 and the second external device 30. As a result, the capacitor 141 receives the first power E1 which may have surge from the first external device 20 and then further supplies a stabilized second power E2 to the second external device 30 when the first external device 20 supplies power to the second external device 30.

In other words, the surge, occurring at the time when the first external device 20 supplies power, may be absorbed and eliminated by the capacitors 141 included in the connector structure, so that the second external device 30 receiving the power would not be malfunctioned or damaged due to the surge. Further, the life of the second external device 30 is prolonged. In a preferable embodiment, the capacitance of the capacitor 141 is greater than 100 μF, which leads to an ideal effect of absorbing and filtering the surge. In another preferable embodiment, the capacitor is a SMD capacitor or a DIP capacitor. However, the present disclosure is not limited to the capacitances or types of capacitors as described above, and the number and materials of capacitors can be modified according to actual demands. In an example, the number of capacitors may be modified based on different voltage required. In practice, the capacitors applied in the connector structure of the present disclosure include low-resistance equivalent resistors in parallel. The equivalent resistors have some advantageous features such as quick charge/discharge, high efficiency of charge/discharge, high efficiency of power conversion, low-consumption of power as well as a high number of cycles of charge/discharge, etc.

Please refer back to FIG. 1 to FIG. 3. In a practical example, in order to protect the internal elements within the connector structure, the connector structure 1 further includes a first cover 10 and a second cover 11 in addition to the first connector 12, the second connector 13 and the capacitance device 14 as mentioned above. The first cover 10 has a first opening P1 facing in a third direction D3. The second cover 11 is assembled with the first cover 10 to form an accommodating space SP and a second opening P2. The accommodating space SP is communicated with the first opening P1 and the second opening P2 faces in a fourth direction D4. The fourth direction D4 is not parallel to the third direction D3. The first end S1 of the first connector 12 is located in the accommodating space SP and the second end S2 of the first connector 12 is configured to be detachably connected to the first external device 20 through the first opening P1. The third end S3 of the second connector 13 disposed in the accommodating space SP through the second opening P2, and the fourth end S4 of the second connector 13 is adapted to be detachably connected to the second external device 30.

The capacitance device 14 is disposed in the accommodating space SP and configured to be electrically connected to the first end S1 of the first connector 12 and the third end S3 of the second connector 13. In other words, as shown in FIG. 3, when the second cover 11 is assembled with the first cover 10, the capacitance device 14 is covered within the accommodating space SP formed by the first cover 10 and the second cover 11. Therefore, the internal elements (e.g. capacitors on the circuit board or other electronic elements) disposed in the capacitance device 14 are prevented from being damaged by external forces. In this embodiment, the angle between the fourth direction D4 and the third direction D3 is a right angle, which means that the fourth direction D4 is perpendicular to the third direction D3. The said right angle structure is mainly used for improving the configurations of devices (e.g. power supplies) installed in a system, so that users are able to integrate output cables of devices. After the output cables are integrated, the resistance of air flow within an internal space of a computer system is improved so as to decrease the internal temperature of the computer system for maintaining the stabilization of the computer system accordingly. However, the present disclosure is not limited to the right angle structure as described above.

In an embodiment, the capacitance device 14 further includes a circuit board 140. The capacitors 141 are disposed on the circuit board 140, and the circuit board 140 has a first side S5 and a second side S6 opposite to the first side S5. A plurality of first connecting parts 143 is disposed on the first side S5 of the circuit board 140, and a plurality of second connecting parts 145 is disposed on the second side S6 of the circuit board 140. The first connecting parts 143 are adapted to be connected to the first metal terminals 123, and the second connecting parts 145 are adapted to be connected to the second metal terminals 133. Specifically, in a practical implementation, the capacitor 141 is disposed on the circuit board 140 and electrically connected to the first connecting parts 143 and the second connecting parts 145 on the both sides via the traces on the circuit board 140 so as to be further connected to external devices respectively through the first metal terminals 123 and the second metal terminals 133. By using the circuit board 140, damages of elements due to external forces caused when the connectors are plugged in and removed from the devices can be avoided. However, the circuit board 140 is an optional element. In other embodiments, the capacitors included in the capacitance device 14 are connected to the first metal terminals 123 and the second metal terminals 133 via cables instead of the circuit board as described above.

Figure 5:
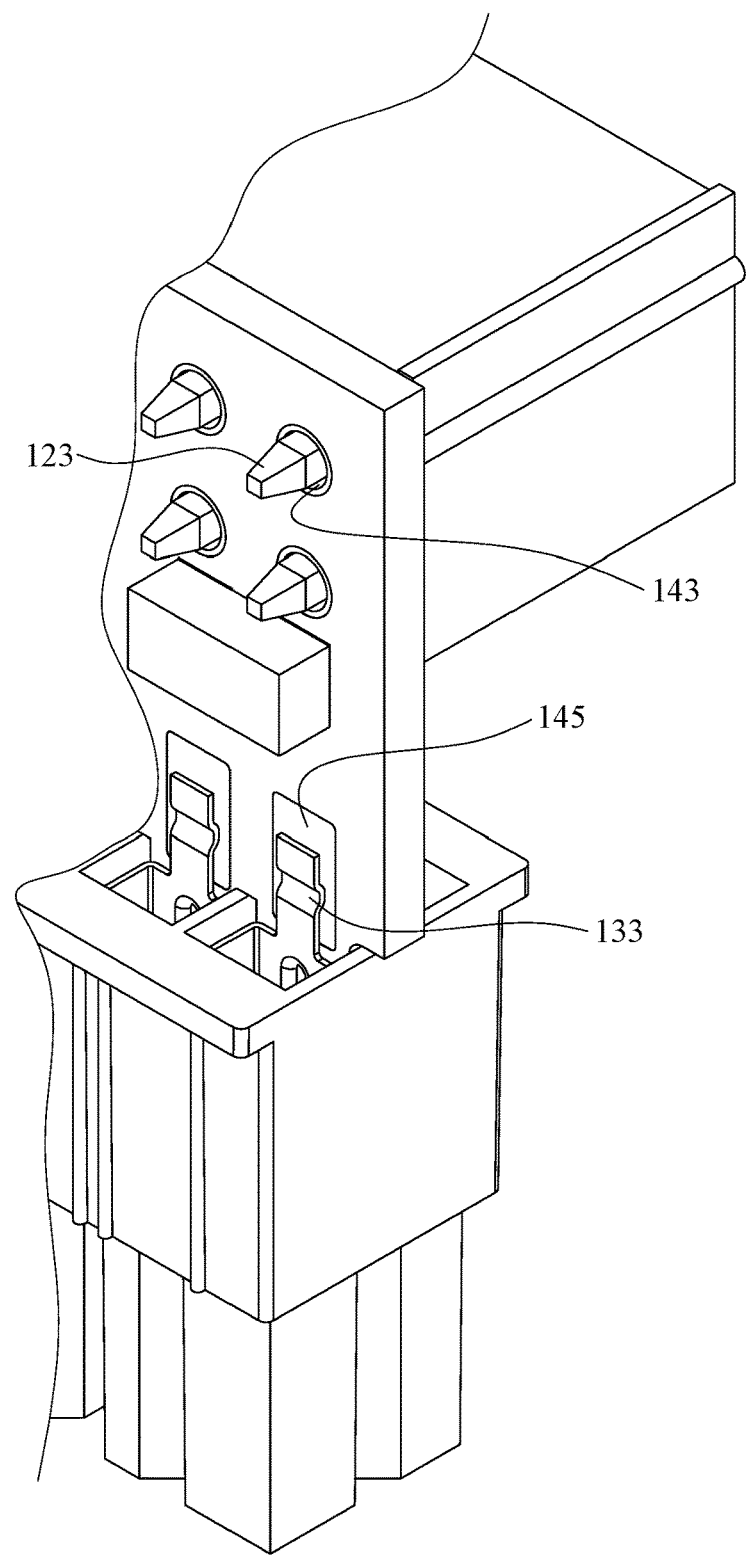
FIG. 5 is a diagram of connections with respect to the connecting parts and metal terminals according to one embodiment of the present disclosure.

Please further refer to FIG. 5, which is a diagram of connections with respect to the connecting parts and metal terminals according to one embodiment of the present disclosure. As shown in FIG. 5, the plurality of first connecting parts 143 is a plurality of connecting holes adapted to be connected to the first metal terminals 123, and the plurality of second connecting parts 145 is a plurality of connecting pads (e.g. copper pads) adapted to be connected to the second metal terminals 133. In detail, the first metal terminals 123 of the first connector 12 is connected to the first connecting parts 143 serving as the connecting holes by welding, and the second metal terminals 133 of the second connector 13 is connected to the second connecting parts 145 by plugging. More specifically, when the second metal terminals 133 is connected to the second connecting parts 145 serving as metal-pads, the second metal terminals 133 contacts with the second connecting parts 145, so as to conduct the circuit loop via the flexibility features of the second metal terminals 133.

Based on the above descriptions, in the connector structure disclosed in the present disclosure, by using the capacitors included in the capacitance device respectively connected to the first connector and the second connector, the surge is filtered and absorbed by receiving power from the first device and then delivering power to the second device when the first connector and the second connector are respectively connected to the first device and the second device. Therefore, the interference of power noise is reduced so as to prevent the devices from being damaged by the surge. Furthermore, in a preferable embodiment, by taking the advantage of the right angle feature of the connector structure, the output cables of the devices can be integrated easily to improve the resistance of air flow within an internal space of a computer system so as to decrease the internal temperature of the computer system for maintaining the stabilization of the computer system accordingly when the both ends of the connector structure are respectively connected to the first device and the second device.

What is claimed is:

1. A connector structure, comprising:
   a first connector having a first end and a second end opposite to the first end, with the first connector having a plurality of first metal terminals extending in a first direction at the first end, wherein the second end of the first connector is configured to be detachably connected to a first external device;
   a second connector having a third end and a fourth end opposite to the third end, with the second connector having a plurality of second metal terminals extending in a second direction at the third end, wherein the second direction is not parallel to the first direction, and the fourth end of the second connector is configured to be detachably connected to a second external device; and
   a capacitance device comprising at least one capacitor electrically connected to the first connector and the second connector respectively through the plurality of first metal terminals and the plurality of second metal terminals;
   wherein the at least one capacitor is configured to receive a first power from the first external device and transmit a second power to the second external device;
   wherein a capacitance of the at least one capacitor is greater than 100 µF.

2. The connector structure according to claim 1, wherein the second direction is perpendicular to the first direction.

3. The connector structure according to claim 1, wherein the second end of the first connector comprises a plurality of first connecting pins adapted to be connected to the first external device serving as a power supply, and the fourth end of the second connector comprises a plurality of second connecting pins adapted to be connected to the second external device serving as a computer motherboard.

4. The connector structure according to claim 1, wherein the capacitance device further comprises:
a circuit board, with the at least one capacitor being disposed on the circuit board, the circuit board having a first side and a second side opposite to the first side, a plurality of first connecting parts being disposed on the first side of the circuit board, a plurality of second connecting parts being disposed on the second side of the circuit board, the plurality of first connecting parts being configured to connect to the plurality of first metal terminals and the plurality of second connecting parts being configured to connect to the plurality of second metal terminals.

5. The connector structure according to claim 4, wherein the plurality of first connecting parts is a plurality of connecting holes adapted to be connected to the plurality of first metal terminals, and the plurality of second connecting parts is a plurality of connecting pads adapted to be connected to the plurality of second metal terminals.

6. The connector structure according to claim 4, wherein the at least one capacitor is a SMD capacitor or a DIP capacitor.

7. A connector structure, comprising:
a first cover having a first opening in a first direction;
a second cover assembled with the first cover to form an accommodating space and a second opening, with the accommodating space communicated with the first opening, and the second opening facing in a second direction not parallel to the first direction;
a first connector having a first end and a second end, with the first end located in the accommodating space and the second end adapted to be detachably connected to a first external device through the first opening;
a second connector having a third end and a fourth end, with the third end disposed in the accommodating space through the second opening and the fourth end adapted to be detachably connected to a second external device; and
a capacitance device disposed in the accommodating space and adapted to be electrically connected to the first end of the first connector and the third end of the second connector;
wherein the capacitance device further comprises at least one capacitor electrically connected to the first connector and the second connector;
wherein a capacitance of the at least one capacitor is greater than 100 μF.

8. The connector structure according to claim 7, wherein the second direction is perpendicular to the first direction.

9. The connector structure according to claim 7, wherein the capacitance device comprises:
a circuit board having a first side and a second side opposite to the first side, with the circuit board comprising a plurality of first connecting parts disposed on the first side and a plurality of second connecting parts disposed on the second side, the plurality of first connecting parts adapted to be connected to a plurality of first metal terminals disposed on the first end of the first connector, and the plurality of second connecting parts adapted to be connected to a plurality of second metal terminals disposed on the third end of the second connector; and
the at least one capacitor disposed on the circuit board and connected to the first connector and the second connector respectively through the plurality of first metal terminals and the plurality of second metal terminals.

10. The connector structure according to claim 9, wherein the plurality of first connecting parts is a plurality of connecting holes adapted to be welded to the plurality of first metal terminals, and the plurality of second connecting parts is a plurality of connecting pads adapted to be plugged to the plurality of second metal terminals.

11. The connector structure according to claim 9, wherein the at least one capacitor is a SMD capacitor or a DIP capacitor.

12. A connector structure, comprising:
a first connector having a first end and a second end opposite to the first end, with the first connector having a plurality of first metal terminals extending in a first direction at the first end, wherein the second end of the first connector is configured to be detachably connected to a first external device;
a second connector having a third end and a fourth end opposite to the third end, with the second connector having a plurality of second metal terminals extending in a second direction at the third end, wherein the second direction is not parallel to the first direction, and the fourth end of the second connector is configured to be detachably connected to a second external device; and
a circuit board electrically connected to the first connector and the second connector respectively through the plurality of first metal terminals and the plurality of second metal terminals;
wherein the circuit board has a first side and a second side opposite to the first side, a plurality of first connecting parts are disposed on the first side of the circuit board, a plurality of second connecting parts are disposed on the second side of the circuit board, the plurality of first connecting parts are configured to connect to the plurality of first metal terminals, and the plurality of second connecting parts are configured to connect to the plurality of second metal terminals;
wherein mounting portions of the plurality of first metal terminals of the first connector are inserted into the plurality of first connecting parts which are a plurality of solder holes arranged on the first side at one end of the circuit board;
wherein mounting portions of the plurality of second metal terminals of the second connector are connected to the second side at another end of the circuit board, and the mounting portions of the plurality of second metal terminals of the second connector are touched by the plurality of second connecting parts of the circuit board along the length of the mounting portions of the plurality of second metal terminals of the second connector.

13. A connector structure, comprising:
a first cover having a first opening in a first direction;
a second cover assembled with the first cover to form an accommodating space and a second opening, with the accommodating space communicated with the first opening, and the second opening facing in a second direction not parallel to the first direction;
a first connector having a first end and a second end, with the first end located in the accommodating space and the second end adapted to be detachably connected to a first external device through the first opening, wherein the first connector has a plurality of first metal terminals extending in the first direction at the first end;

a second connector having a third end and a fourth end, with the third end disposed in the accommodating space through the second opening and the fourth end adapted to be detachably connected to a second external device, wherein the second connector has a plurality of second metal terminals extending in the second direction at the third end; and a circuit board disposed in the accommodating space and adapted to be electrically connected to the first end of the first connector and the third end of the second connector respectively through the plurality of first metal terminals and the plurality of second metal terminals;

wherein the circuit board has a first side and a second side opposite to the first side, a plurality of first connecting parts are disposed on the first side of the circuit board, a plurality of second connecting parts are disposed on the second side of the circuit board, the plurality of first connecting parts are configured to connect to the plurality of first metal terminals, and the plurality of second connecting parts are configured to connect to the plurality of second metal terminals;

wherein mounting portions of the plurality of first metal terminals of the first connector are inserted into the plurality of first connecting parts which are a plurality of solder holes arranged on the first side at one end of the circuit board;

wherein mounting portions of the plurality of second metal terminals of the second connector are inserted into the accommodation space and connected to the second side at another end of the circuit board, and the mounting portions of the plurality of second metal terminals of the second connector are touched by the plurality of second connecting parts of the circuit board along the length of the mounting portions of the plurality of second metal terminals of the second connector.

* * * * *